US006603240B1

(12) United States Patent
Kohno et al.
(10) Patent No.: US 6,603,240 B1
(45) Date of Patent: Aug. 5, 2003

(54) SENSOR ARRAY, METHOD FOR MANUFACTURING SENSOR ARRAY, AND ULTRASONIC DIAGNOSTIC APPARATUS USING THE SAME

(75) Inventors: Yoshiaki Kohno, Moriyama (JP); Masato Yabuuchi, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/670,150

(22) Filed: Sep. 26, 2000

(30) Foreign Application Priority Data

Sep. 27, 1999 (JP) ........................................ 11-273078

(51) Int. Cl.$^7$ ........................................ H01L 41/083

(52) U.S. Cl. ........................................ 310/334; 310/366

(58) Field of Search ........................................ 310/328, 334, 310/366

(56) References Cited

U.S. PATENT DOCUMENTS

| | | | | | |
|---|---|---|---|---|---|
| 5,329,496 | A | * | 7/1994 | Smith | 310/334 |
| 5,381,385 | A | | 1/1995 | Greenstein | 367/40 |
| 5,548,564 | A | * | 8/1996 | Smith | 310/334 |
| 5,704,105 | A | | 1/1998 | Venkataramani et al. | 29/25.35 |
| 5,744,898 | A | * | 4/1998 | Smith et al. | 310/334 |
| 5,825,262 | A | * | 10/1998 | Inoue et al. | 310/328 |
| 5,906,580 | A | | 5/1999 | Kline-Schoder et al. | 600/459 |
| 5,925,971 | A | * | 7/1999 | Unami | 310/328 |
| 5,945,770 | A | * | 8/1999 | Hanafy | 310/334 |
| 5,945,773 | A | * | 8/1999 | Nagashima | 310/328 |
| 5,962,956 | A | * | 10/1999 | Unami et al. | 310/328 |
| 6,066,911 | A | * | 5/2000 | Lindemann et al. | 310/328 |
| 6,091,180 | A | * | 7/2000 | Unami et al. | 310/328 |
| 6,111,343 | A | * | 8/2000 | Unami et al. | 310/328 |
| 6,483,228 | B2 | * | 11/2002 | Hashimoto | 310/336 |

FOREIGN PATENT DOCUMENTS

| | | | | |
|---|---|---|---|---|
| JP | 57-193199 | * | 11/1982 | 310/328 |
| JP | 11-146493 | * | 5/1999 | 310/328 |
| JP | 2000-25227 | * | 1/2000 | 310/328 |
| WO | 9409605 | | 4/1994 | H04R/17/00 |

* cited by examiner

*Primary Examiner*—Thomas M. Dougherty
(74) *Attorney, Agent, or Firm*—Keating & Bennett, LLP

(57) ABSTRACT

A highly sensitive sensor array can be easily manufactured. An ultrasonic probe as the sensor array used in an ultrasonic diagnostic apparatus includes a substrate formed of a backing member. On a main surface of the substrate, a plurality of piezoelectric oscillators is fixed in a matrix form. Each of the piezoelectric oscillators includes a plurality of laminated piezoelectric layers. Between the piezoelectric layers, inner electrodes are formed. On each end face of the piezoelectric layers, an outer electrode is formed. The piezoelectric oscillators are bonded onto the substrate by adhesive in such a manner that the plurality of piezoelectric layers is laminated in a direction parallel to the main surface of the substrate. On the plurality of piezoelectric oscillators, an acoustic matching layer is formed, and on the acoustic matching layer, an acoustic lens is formed.

3 Claims, 5 Drawing Sheets

SENSOR ARRAY, METHOD FOR MANUFACTURING SENSOR ARRAY, AND ULTRASONIC DIAGNOSTIC APPARATUS USING THE SAME

BACKGROUND OF THE INVENTION

1. Field of the Invention

The present invention relates to sensor arrays, methods for manufacturing the sensor arrays, and ultrasonic diagnostic apparatuses incorporating the same. More particularly, the invention relates to sensor arrays such as ultrasonic probes used in ultrasonic diagnostic apparatuses, ultrasonic microscopes, metal flaw detecting apparatuses, and the like.

2. Description of the Related Art

Concerning the background of the present invention, an ultrasonic probe used in a conventional ultrasonic diagnostic apparatus will be described. For example, there is an ultrasonic probe disclosed in IEEE Transactions on Utltrasonics, Ferroelectrics, and Frequency Control, Vol. 44, No. 2, March 1997 Hybrid Multi/Single Layer Array Transducers for Increased Signal-to-Noise Ratio.

FIG. 7 is a perspective view showing the main part of an ultrasonic probe used in the conventional ultrasonic diagnostic apparatus. FIG. 8 is a perspective view showing a piezoelectric oscillator used in the ultrasonic probe. An ultrasonic probe 1 shown in FIG. 7 includes a substrate 2 formed of an acoustic absorber regarded as a backing member. A plurality of piezoelectric oscillators 3 is fixed on one main surface of the substrate 2 in a matrix form.

As shown in FIG. 8, the piezoelectric oscillators 3 include a plurality of laminated piezoelectric layers 4. Inner electrodes 5 are formed between the piezoelectric layers 4. An outer electrode 6 is formed on each of the top and bottom surfaces of the laminated piezoelectric layers 4. In addition, on both ends of the laminated piezoelectric layers 4, via-holes 7 are formed. Connecting electrodes 8 are formed inside the via-holes 7. Every other layer of the laminated piezoelectric layers 4 is polarized in a reverse thickness direction. The piezoelectric oscillators 3 are bonded onto one main surface of the substrate 2 by adhesive in such a manner that the main surfaces of the piezoelectric layers 4 are parallel to the main surface of the substrate 2.

Furthermore, on the plurality of piezoelectric oscillators 3, an acoustic matching layer 9 is formed to obtain acoustic matching with a human body. On the acoustic matching layer 9, an acoustic lens 10 is formed to converge ultrasonic beams.

In the piezoelectric oscillators 3 used in the above ultrasonic probe 1, the inner electrodes 5 are extracted by the via-holes 7 and the like. However, alternatively, as the structure and method for extracting the inner electrodes, there is a structure and method for extracting the inner electrodes from side surfaces of the piezoelectric oscillators 3, as usually seen in multi-layer capacitors and the like.

Since each of the piezoelectric oscillators 3 used in the above ultrasonic probe 1 shown in FIG. 7 has a multi-layer structure, good functionality and high-resolution capability can be achieved, so that high sensitivity can be obtained. When the piezoelectric oscillators 3 are manufactured, via-holes need to be formed with high processing precision and electrodes need to be formed with high printing precision. As a result, due to shrinkage occurring when a member is burned, it is difficult to obtain linearity between the via-holes, and it is also difficult to cut the burned member in a matrix form. In addition, after cutting, outer electrodes easily fall off. Therefore, in order to manufacture the piezoelectric oscillators 3, extremely high manufacturing precision is necessary. Since there are many problems in terms of manufacturing, variations in characteristics easily occur.

Similarly, when the inner electrodes 5 of the piezoelectric oscillators 3 are extracted from the side surfaces in the ultrasonic probe 1, a high processing precision is required in manufacturing.

SUMMARY OF THE INVENTION

Accordingly, it is an object of the present invention to provide a sensor array that is highly sensitive and capable of being easily manufactured.

It is another object of the present invention to provide a method for manufacturing the above sensor array.

In addition, it is another object of the present invention to provide an ultrasonic diagnostic apparatus using the above sensor array.

The present invention provides a sensor array including a substrate and a plurality of piezoelectric oscillators fixed on a main surface of the substrate in a matrix form. Each of the plurality of piezoelectric oscillators includes a plurality of piezoelectric layers laminated in a direction parallel to the main surface of the substrate, inner electrodes disposed between the plurality of piezoelectric layers, and outer electrodes formed on end faces of the plurality of piezoelectric layers.

The present invention provides a method for manufacturing the above sensor array. The method includes the step of forming a multi-layer structure in which a plurality of piezoelectric layers and a plurality of inner electrodes are laminated, the step of forming a motherboard by cutting the multi-layer structure in the laminated direction, the step of forming outer electrodes on both main surfaces of the motherboard, the step of fixing the motherboard on one main surface of a substrate, and the step of cutting the motherboard to yield the plurality of piezoelectric oscillators.

The present invention provides an ultrasonic diagnostic apparatus including an ultrasonic probe, wherein the ultrasonic probe includes the above sensor array.

In the sensor array according to the present invention, since the piezoelectric oscillators having the multi-layer structure are used, high sensitivity can be obtained.

In addition, as described above, this sensor array can be manufactured by forming the multi-layer structure in which the plurality of piezoelectric layers and the plurality of inner electrodes are laminated, forming the motherboard by cutting the multi-layer structure in the laminated direction, forming the outer electrodes on the main surfaces of the motherboard, fixing the motherboard on one of the main surfaces of the substrate, and cutting the motherboard into the plurality of piezoelectric oscillators. As a result, when the motherboard is fixed on the substrate, since the outer electrodes are formed on the entire main surfaces of the motherboard, no high precision for determining positions is necessary. Thus, this method permits manufacturing of the sensor array to be facilitated.

In addition to the above-described objects of the present invention, other objects, characteristics, and advantages thereof will be clarified by the detailed description of embodiments of the present invention with reference to the drawings.

DESCRIPTION OF THE PREFERRED EMBODIMENTS

Figure 1:
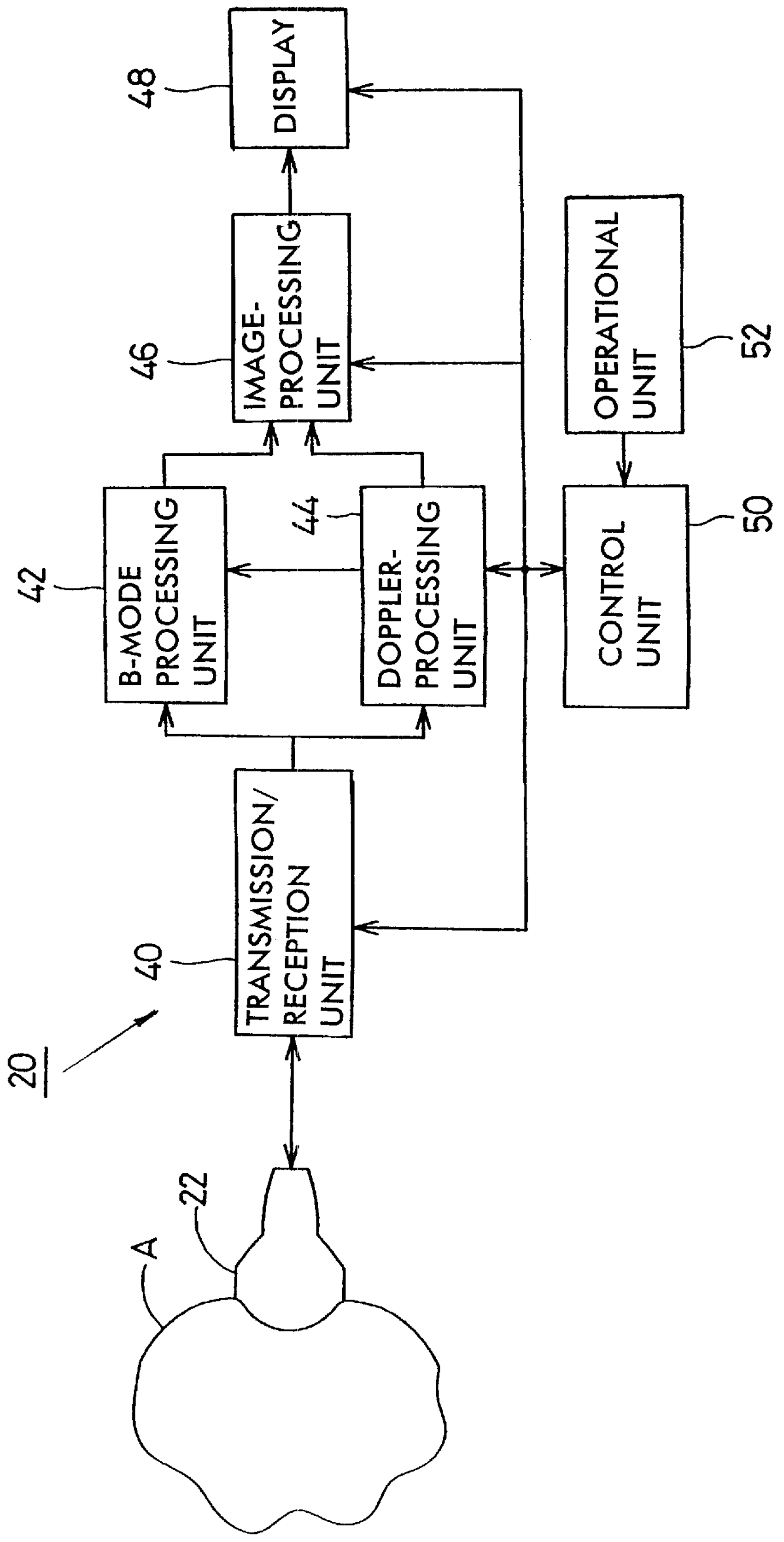
FIG. 1 is a block diagram of a ultrasonic diagnostic apparatus according to an embodiment of the present invention.
Figure 2:
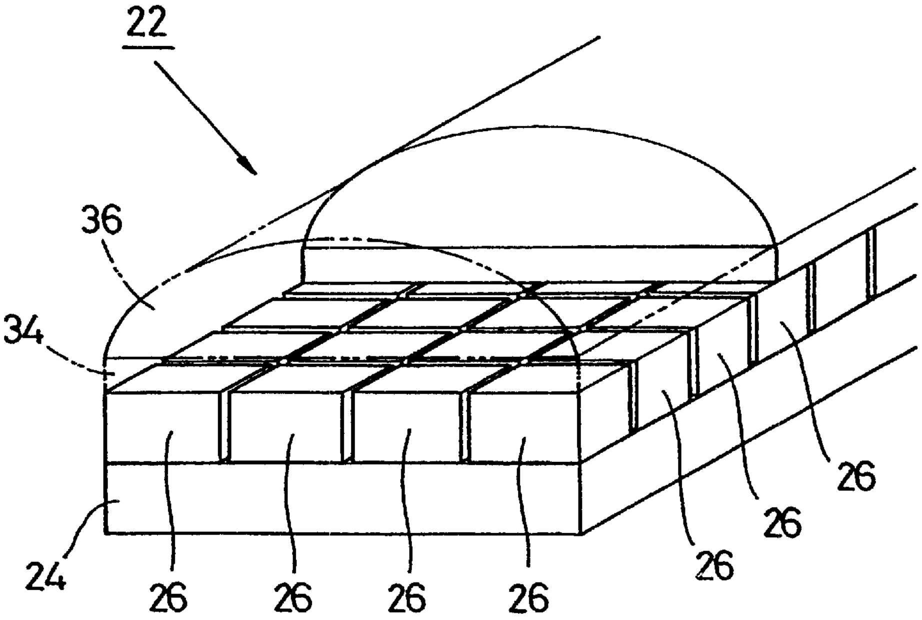
FIG. 2 is a perspective view showing the main part of an ultrasonic probe used in the ultrasonic diagnostic apparatus shown in FIG. 1.
Figure 3:
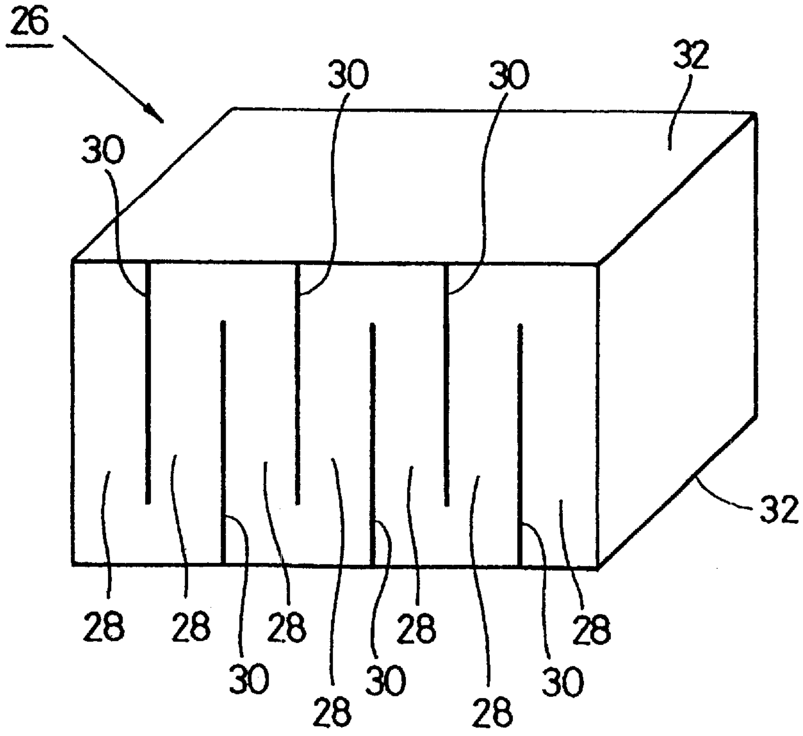
FIG. 3 is a perspective view showing a piezoelectric oscillator used in the ultrasonic probe shown in FIG. 2.

FIG. 1 is a block diagram of an ultrasonic diagnostic apparatus according to an embodiment of the present invention. FIG. 2 is a perspective view showing the main part of an ultrasonic probe used in the ultrasonic diagnostic apparatus shown in FIG. 1. FIG. 3 is a perspective view showing a piezoelectric oscillator used in the ultrasonic probe. An ultrasonic diagnostic apparatus 20 shown in FIG. 1 includes an ultrasonic probe 22.

The ultrasonic probe 22, as shown in FIG. 2, includes a substrate 24 formed of an acoustic absorber, which is regarded as a backing member. On one of the main surfaces of the substrate 24, a plurality of piezoelectric oscillators 26 is fixed in a matrix form. FIG. 2 shows the plurality of piezoelectric oscillators 26 arranged in four lines. However, actually, the piezoelectric oscillators 26 are arranged in many more lines.

As shown in FIG. 3, the piezoelectric oscillators 26 include a plurality of laminated piezoelectric layers 28 formed of a material having a relative permittivity of substantially 2000. Between the piezoelectric layers 28, inner electrodes 30 are formed. In this case, the inner electrodes 30 are alternately formed from one end of the piezoelectric layer 28 to the center thereof and from the other end of the piezoelectric layer 28 to the center thereof. Furthermore, on both end faces of the piezoelectric layers 28, outer electrodes 32 are formed. The one-side outer electrode 32 is connected to the every other inner electrode 30, and the other-side outer electrode 32 is connected to the remaining every other inner electrode 30. Additionally, these piezoelectric layers 28 are polarized alternately in a reverse thickness direction. Regarding each of the piezoelectric oscillators 26, an outer dimension thereof, that is, edges of the outer electrode 32 is set to be 250 $\mu$m, respectively, and the thickness thereof, that is, the distance between the outer electrodes 32 is set to be preferably more than or equal to two times the outer dimension in order to prevent coupling between a length oscillation (d31 mode) as a main mode and other unnecessary oscillations. For example, the thickness of the piezoelectric oscillator 26 is preferably set to be 500 $\mu$m. Furthermore, in each of the piezoelectric oscillators 26, five to seven piezoelectric layers 28 are preferably formed due to the balance between impedance matching and wave-receiving sensitivity. For example, seven piezoelectric layers 28 may be formed. Then, each of the piezoelectric oscillators 26 is bonded onto the substrate 24 by adhesive such that the plurality of piezoelectric layers 28 is laminated in a direction parallel to the main surface of the substrate 24, that is, the laminating direction of the piezoelectric layers is parallel to the main surface of the substrate.

In the above piezoelectric oscillators 26, the inner electrodes 30 are alternately connected to the opposite outer electrode 32. However, the structure of the piezoelectric oscillator 26 is not limited to this case. For example, the inner electrodes 30 may not be connected to the outer electrodes 32.

Furthermore, among the plurality of piezoelectric oscillators 26, wave-transmitting oscillators and wave-receiving oscillators have different optimum values. Thus, the two types of oscillators may have different configurations.

Additionally, on the plurality of piezoelectric oscillators 26, an acoustic matching layer 34 is provided to obtain an acoustic matching with human bodies. On the acoustic matching layer 34, an acoustic lens 36 is provided to converge ultrasonic beams.

The outer electrodes 32 of the piezoelectric oscillators 26 in the ultrasonic probe 22 are connected to a transmission/reception unit 40 via pattern electrodes (not shown) disposed on the acoustic matching layer 34 and conductors (not shown) disposed inside via-holes penetrating the substrate 24. The transmission/reception unit 40 serves as a unit for driving the ultrasonic probe 22 and receiving ultrasonic waves. The transmission/reception unit 40 supplies a driving signal to the ultrasonic probe 22 to transmit an ultrasonic wave into a subject A. In addition, the transmission/reception unit 40 receives an echo signal from the subject A received by the ultrasonic probe 22.

The transmission/reception unit 40 is connected to a B-mode processing unit 42 and a Doppler-processing unit 44. Thus, an echo-reception signal for every sound ray, which is output from the transmission/reception unit 40, is input to the B-mode processing unit 42 and the Doppler-processing unit 44.

The B-mode processing unit 42 and the Doppler-processing unit 44 are connected to an image-processing unit 46. The B-mode processing unit 42, the Doppler-processing unit 44, and the image-processing unit 46 serve as image-generating units. The image-processing unit 46 forms a B-mode image and a Doppler image based on data input from the B-mode processing unit 42 and the Doppler-processing unit 44, respectively.

The image-processing unit 46 is connected to a display 48. The display 48 receives an image signal from the image-processing unit 46 to display an image based on the received image signal.

The above-described transmission/reception unit 40, the B-mode processing unit 42, the Doppler-processing unit 44, the image-processing unit 46, and the display 48 are connected to a control unit 50. The control unit 50 supplies a control signal to each of these units to control the operations thereof. In addition, various notice signals from the above units controlled by the control unit 50 are input to the control unit 50. Under the control performed by the control unit 50, B-mode operations and Doppler-mode operations are performed.

The control unit 50 is connected to an operational unit 52. An operator operates the operational unit 52 to input desirable commands and information to the control unit 50. The operational unit 52 is constituted of an operational panel having a keyboard and other operations tools.

Next, a description will be given of an example of the method for manufacturing the ultrasonic probe 22 used in the ultrasonic diagnostic apparatus 20.

Figure 4:
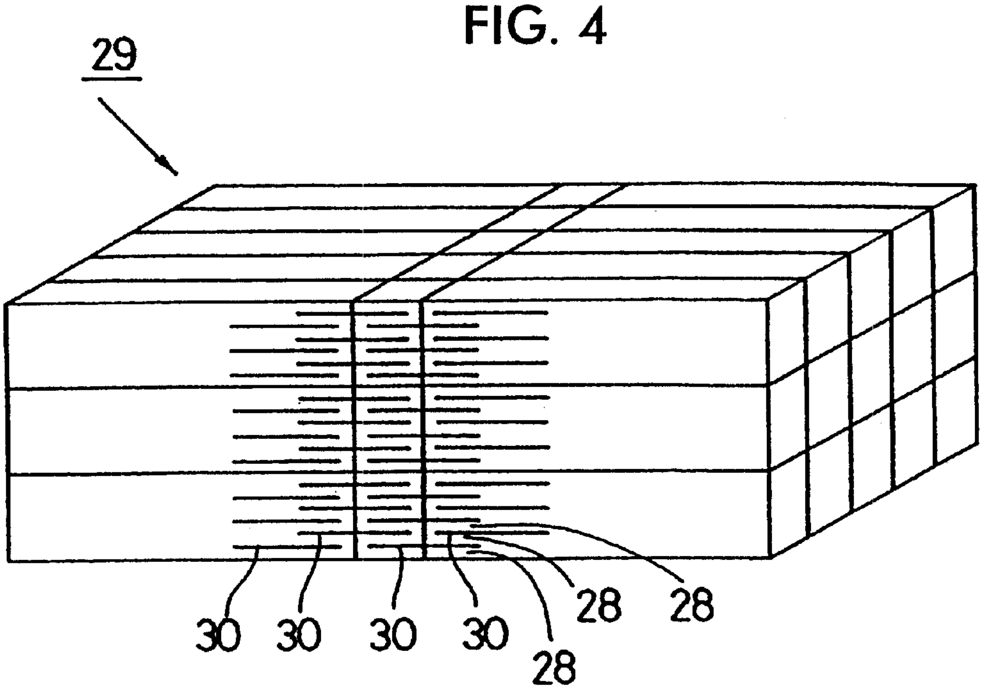
FIG. 4 is an illustration showing a first step of a procedure for manufacturing the ultrasonic probe shown in FIG. 2.

First, as shown in FIG. 4, a multi-layer structure 29 is formed by laminating a plurality of piezoelectric layers 28 and a plurality of inner electrodes 30. In this case, the multi-layered structure 29 is formed by simultaneously firing both the piezoelectric layers 28 and the inner electrodes 30. Furthermore, the positional arrangement of the inner electrodes 30 can be freely changed by considering cutting widths for later cutting, widths necessary for piezoelectric oscillators 26, and the distance between the piezoelectric oscillators 26 after cutting. In FIG. 4, the piezoelectric layers 28 and the inner electrodes 30 are shown in a simplified manner.

Figure 5:
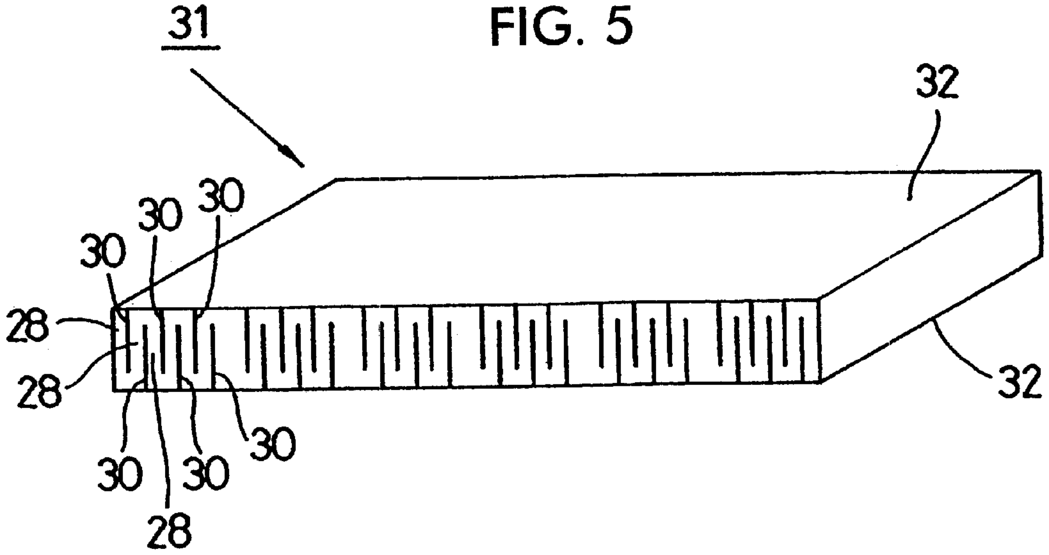
FIG. 5 is an illustration showing a second step of the procedure for manufacturing the ultrasonic probe shown in FIG. 2.

Next, the multi-layer structure 29 is cut in the laminated direction as shown in FIG. 4, and a motherboard 31 is formed as shown in FIG. 5. In this embodiment, the multi-layer structure 29 is cut into the motherboard 31 after firing the multi-layer structure 29. However, before firing the multi-layer structure 29, the multi-layer structure 29 may be cut into the motherboard 31. When the motherboard 31 is cut away from the multi-layer structure 29 before firing the multi-layer structure 29, the motherboard 31 can be fired after being cut.

Then, outer electrodes 32 are formed on both main surfaces of the motherboard 31.

A DC voltage is applied between the two outer electrodes 32, whereby the plurality of piezoelectric layers 28 is polarized alternately in a reverse thickness direction. Further, in the present invention, for example, the piezoelectric layers 28 may be polarized at the intervals of two layers in the reverse thickness direction. In other words, the present invention is not restricted to the above arrangement in which the piezoelectric layers 28 are polarized alternately in the reverse thickness direction.

The motherboard 31 is bonded onto one of main surfaces of the substrate 24. In this case, no high precision for a position at which the motherboard 31 is bonded onto the substrate 24 is necessary, and any deviation leads to no serious problems.

Figure 6:
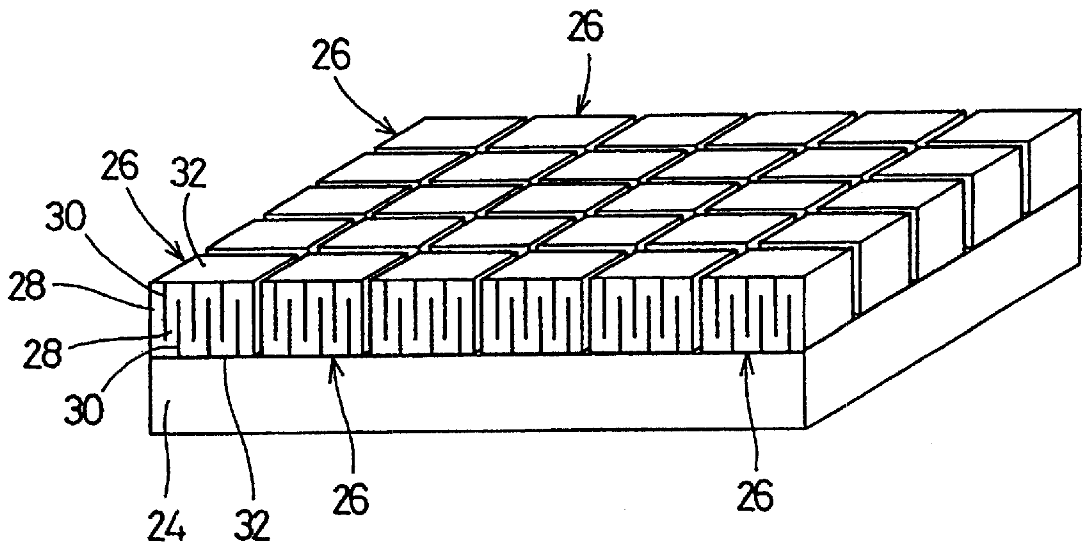
FIG. 6 is an illustration showing a third step of the procedure for manufacturing the ultrasonic probe shown in FIG. 2.

Then, as shown in FIG. 5, the motherboard 31 is cut in a matrix form by a dicing method or the like to obtain the plurality of piezoelectric oscillators 26. In this case, no high precision for cutting the motherboard 31 is required, and any deviation leads to no serious problems. In FIG. 6, the plurality of piezoelectric oscillators 26 is arranged in five rows and six columns. However, other arrangements may be made in different numbers of rows and columns.

After that, an acoustic matching layer 34 is formed on the plurality of piezoelectric oscillators 26, and an acoustic lens 36 is formed on the acoustic matching layer 34.

In the two-dimensional ultrasonic probe 22 of the ultrasonic diagnostic apparatus 20 adapted to three-dimensional imagining and high-resolution performance, the piezoelectric oscillators 26 having the multi-layer structures are used. As a result, the same impedance matching and wave-receiving sensitivity as those obtained in the conventional ultrasonic probe 1 shown in FIG. 7 can be obtained, whereby high performance can be achieved.

Furthermore, in the ultrasonic diagnostic apparatus 20, with the use of the piezoelectric oscillators 26 having the multi-layer structures, no complicated procedures and no high processing precision concerning formation of via-holes and cutting in accordance with the via-holes are required. Therefore, the manufacturing process can be simplified, and when the piezoelectric oscillators 26 are manufactured, no high processing precision is necessary. As a result, in the ultrasonic probe 22 shown in FIG. 2, characteristic variations between the piezoelectric oscillators 26 can be reduced and high-resolution performance can thereby be obtained.

Figure 7:
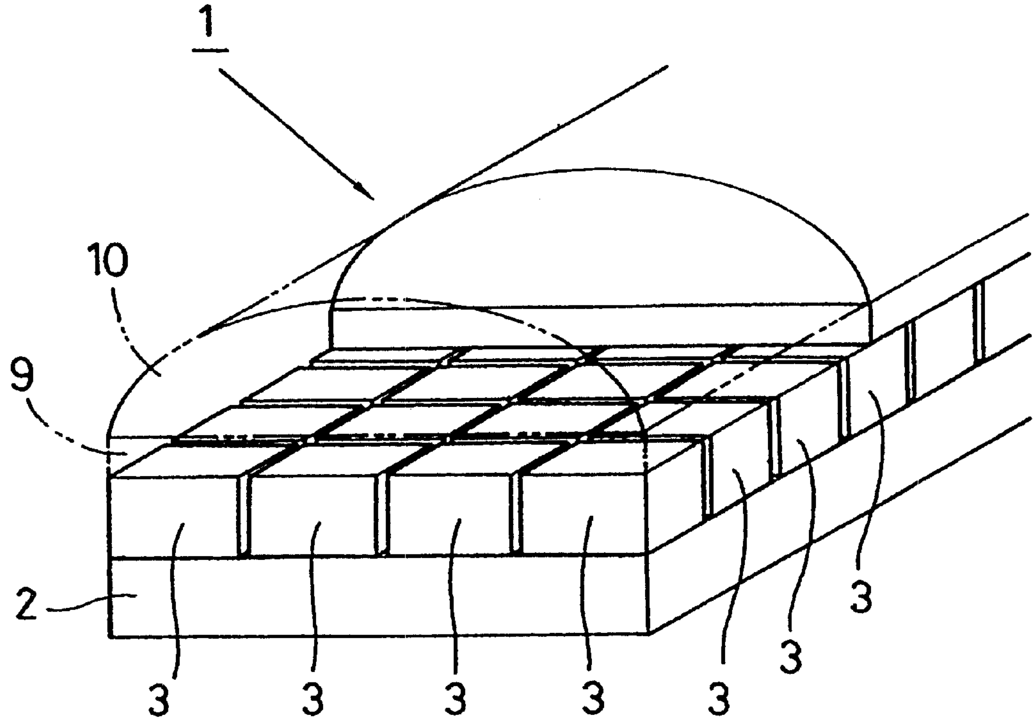
FIG. 7 is a perspective view showing the main part of an ultrasonic probe used in a conventional ultrasonic diagnostic apparatus.
Figure 8:
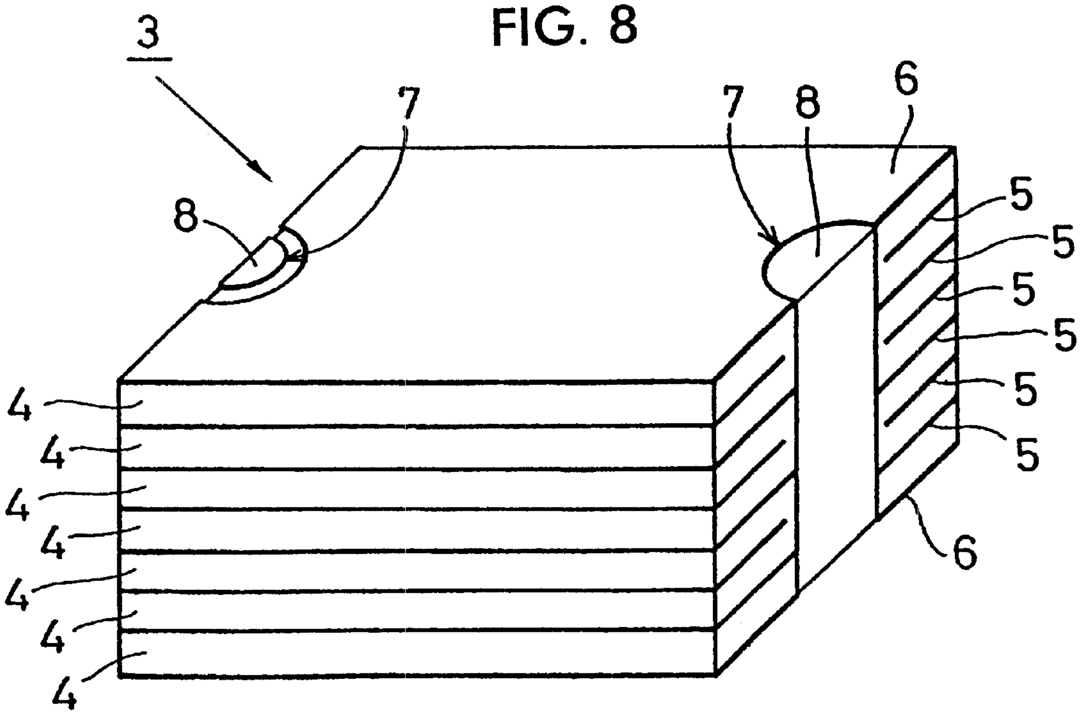
FIG. 8 is a perspective view showing a piezoelectric oscillator used in the ultrasonic probe shown in FIG. 7.

In addition, in the ultrasonic probe 1 shown in FIG. 7, the piezoelectric oscillators 3 shown in FIG. 8 are arranged on the substrate 2 in the matrix form. When a large number of piezoelectric oscillators 3 are arranged on the substrate 2, as in the case of the above manufacturing method described with reference to FIGS. 4 to 6, usually, the piezoelectric oscillators are obtained by cutting away from a motherboard or a multi-layer structure on which piezoelectric oscillators 3 are arranged in a matrix form.

However, in the case of piezoelectric oscillators 3 shown in FIG. 8, due to variations in the positions of the via-holes 7, dicing in accordance with the positions of the via-holes 7 is required. In addition, the distance between the piezoelectric oscillators 3 after cutting cannot be adjusted.

In contrast, in the piezoelectric oscillators 26 used in the ultrasonic diagnostic apparatus 20, with the use of the above manufacturing method, the complicated procedures and high dimensional precision for forming the via-holes are not required. Moreover, this method can solve problems occurring when dicing is performed.

In addition, in the ultrasonic probe 22, it is possible to obtain a large number of piezoelectric oscillators 26 from the large-sized multi-layer structure 29 as shown in FIG. 4. Moreover, when the piezoelectric oscillators 26 are obtained by cutting, it is not necessary to cut in accordance with the via-holes. Furthermore, when the multi-layer structure 29 shown in FIG. 4 is formed, cutting widths, the widths of the piezoelectric oscillators 26, and the distance between the piezoelectric oscillators 26 after cutting, which are supposed to be obtained in the later procedures, can be considered so that the distance between the inner electrodes 30 can be freely determined. As a result, advantages in cost reduction and freedom in designing can be increased.

In the above ultrasonic diagnostic apparatus 20, the piezoelectric oscillators 26 having specified dimensions are used in the ultrasonic probe 22. However, the piezoelectric oscillators 26 used in the ultrasonic probe 22 may have other dimensions.

Furthermore, although the ultrasonic diagnostic apparatus 20 includes the transmission/reception unit 40 and the other units in addition to the ultrasonic probe 22, these units may be replaced with other units.

The present invention is not limited to sensor arrays such as ultrasonic probes used in ultrasonic diagnostic apparatuses. For example, the invention can be applied to sensor arrays used in supersonic microscopes and metal-flaw detecting apparatuses.

As described above, the present invention provides a sensor array that is highly sensitive and capable of being easily manufactured. In addition, the invention provides the method for manufacturing the above sensor array and the ultrasonic diagnostic apparatus incorporating the sensor array.

While the present invention has been particularly shown and described with reference to preferred embodiments thereof, it will be understood by those skilled in the art that the foregoing and other changes in form and details can be made therein without departing from the spirit and scope of the invention.

What is claimed is:

1. A sensor array comprising:

a substrate; and a plurality of piezoelectric oscillators fixed on a main surface of the substrate in a matrix form, the main surface of the substrate extending in a plane defined by transverse x and y directions, each of the piezoelectric oscillators comprising:

a plurality of piezoelectric layers which extend in a z-direction transverse to the plane defined by the x and y directions and which are laminated in the x or y direction of the main surface of the substrate;

inner electrodes disposed between the plurality of piezoelectric layers; and outer electrodes formed on end faces of the plurality of piezoelectric layers.

2. A method for manufacturing the sensor array according to claim 1, comprising the steps of:

forming a multi-layer structure in which a plurality of piezoelectric layers and a plurality of inner electrodes are laminated;

forming a motherboard by cutting the multi-layer structure in the laminated direction;

forming outer electrodes on both main surfaces of the motherboard;

fixing the motherboard on a main surface of a substrate; and cutting the motherboard to yield the plurality of piezoelectric oscillators.

3. An ultrasonic diagnostic apparatus comprising an ultrasonic probe, wherein the ultrasonic probe comprises the sensor array according to claim 1.

* * * * *